United States Patent
Geurts

(10) Patent No.: US 9,853,080 B2
(45) Date of Patent: Dec. 26, 2017

(54) PIXELS WITH MULTIPLE CHARGE STORAGE REGIONS

(71) Applicant: SEMICONDUCTOR COMPONENTS INDUSTRIES, LLC, Phoenix, AZ (US)

(72) Inventor: Tomas Geurts, Haasrode (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 198 days.

(21) Appl. No.: 14/870,522

(22) Filed: Sep. 30, 2015

(65) Prior Publication Data
US 2017/0092683 A1 Mar. 30, 2017

(51) Int. Cl.
*H01L 27/146* (2006.01)

(52) U.S. Cl.
CPC .. *H01L 27/14643* (2013.01); *H01L 27/14605* (2013.01); *H01L 27/14607* (2013.01); *H01L 27/14612* (2013.01); *H01L 27/1464* (2013.01); *H01L 27/14609* (2013.01)

(58) Field of Classification Search
CPC ......... H01L 27/14643; H01L 27/14612; H01L 27/14609; H01L 27/14607; H01L 27/1464
USPC ...................................... 250/208.1
See application file for complete search history.

(56) References Cited

U.S. PATENT DOCUMENTS

| | | | |
|---|---|---|---|
| 7,960,768 B2 | 6/2011 | Dungan et al. | |
| 8,368,157 B2 | 2/2013 | Lenchenkov | |
| 8,890,047 B2 | 11/2014 | Solhusvik et al. | |
| 2011/0019051 A1* | 1/2011 | Yin | H04N 5/347 348/311 |
| 2013/0113967 A1* | 5/2013 | Wang | H04N 5/347 348/302 |
| 2013/0187210 A1* | 7/2013 | Kobayashi | H01L 27/14603 257/292 |
| 2013/0214371 A1* | 8/2013 | Asatsuma | H01L 31/02325 257/432 |
| 2013/0229556 A1* | 9/2013 | Suzuki | H01L 27/14609 348/300 |

OTHER PUBLICATIONS

Velichko et al., U.S. Appl. No. 14/836,599, filed Aug. 26, 2015.
Innocent et al., "Differential image sensor with high common mode rejection." Proceedings of the 31st European Solid-State Circuits Conference, 2005. ESSCIRC 2005. pp. 483-386.

* cited by examiner

*Primary Examiner* — Seung C Sohn
(74) *Attorney, Agent, or Firm* — Treyz Law Group, P.C.; Joseph F. Guihan

(57) ABSTRACT

An imaging pixel may be provided with a photodiode and a floating diffusion region. The pixel may include multiple charge storage regions interposed between the photodiode and the floating diffusion region. A first charge storage region may be used to store charge from the photodiode for global shutter functionality. A second charge storage region may not be coupled to the photodiode. The second charge storage region may be used to determine how much charge is generated in the charge storage region from incident light on the charge storage region. The second charge storage region may help account for incident light noise in the first charge storage region. The second charge storage region may be the same size as the first charge storage region, or may be smaller than the first charge storage region.

15 Claims, 9 Drawing Sheets

PIXELS WITH MULTIPLE CHARGE STORAGE REGIONS

BACKGROUND

This relates generally to imaging systems, and more particularly, to imaging systems with global shutter functionality.

Modern electronic devices such a cellular telephones, cameras, and computers often use digital image sensors. Imagers (i.e., image sensors) often include a two-dimensional array of image sensing pixels. Each pixel typically includes a photosensor such as a photodiode that receives incident photons (light) and converts the photons into electrical signals.

Conventional image sensors are fabricated on a semiconductor substrate using complementary metal-oxide-semiconductor (CMOS) technology or charge-coupled device (CCD) technology. In CMOS image sensors, a rolling shutter or a global shutter may be used. In CMOS image sensors with a global shutter, a charge storage region is typically incorporated into each pixel to store charge from the photodiode until read out. However, incident light that is not converted to charge in the photodiode may affect the charge levels in the charge storage region. This may increase noise in the pixels and decrease the image quality of the image sensor.

It would therefore be desirable to be able to provide improved CMOS image sensors with global shutter functionality.

DETAILED DESCRIPTION

Electronic devices such as digital cameras, computers, cellular telephones, and other electronic devices include image sensors that gather incoming image light to capture an image. The image sensors may include arrays of imaging pixels. The pixels in the image sensors may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
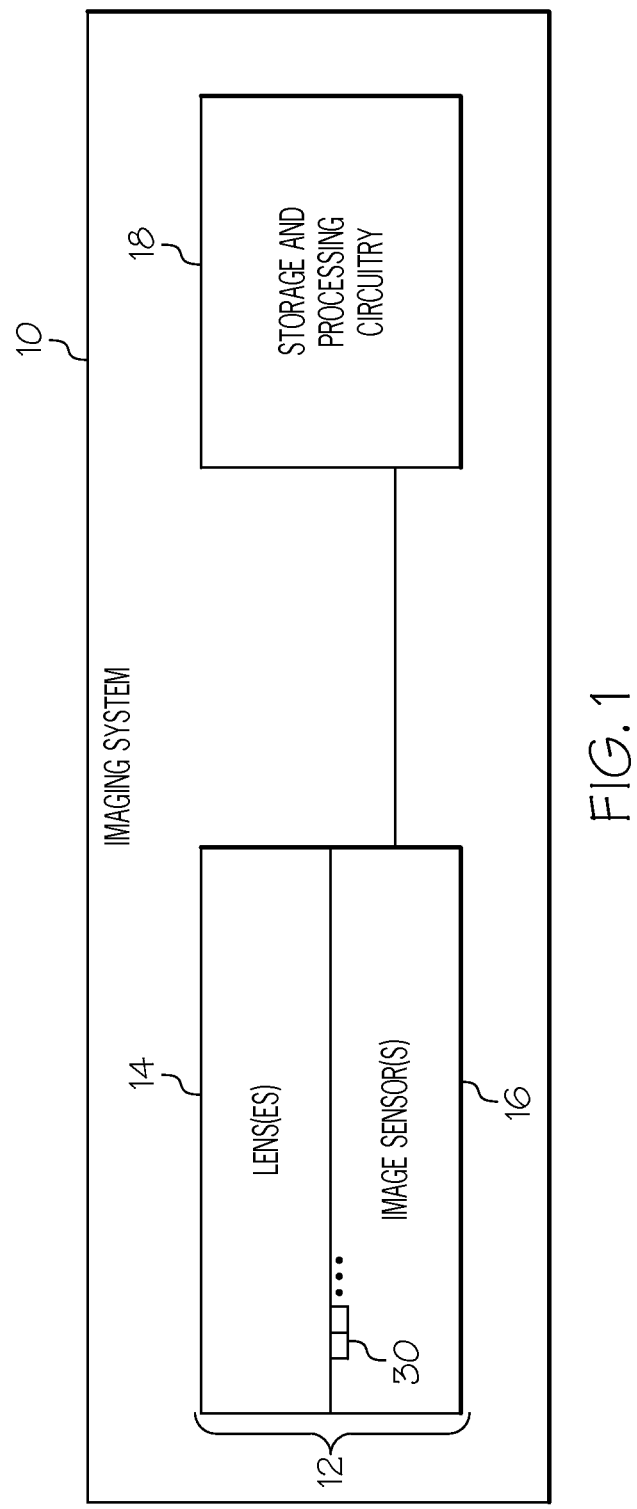
FIG. 1 is a diagram of an illustrative imaging system that may include an image sensor having image pixels with a global shutter in accordance with an embodiment of the present invention.

FIG. 1 is a diagram of an illustrative imaging system that uses an image sensor with a global shutter. Imaging system 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor integrated circuit die with an array of image pixels 30. Image pixels 30 may each include a shutter element for controlling when charge is acquired on the image pixel.

During image capture operations, lens 14 may focus light from a scene onto an image pixel array in image sensor 16. Image sensor 16 may provide corresponding digital image data to control circuitry such as storage and processing circuitry 18. Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Figure 2:
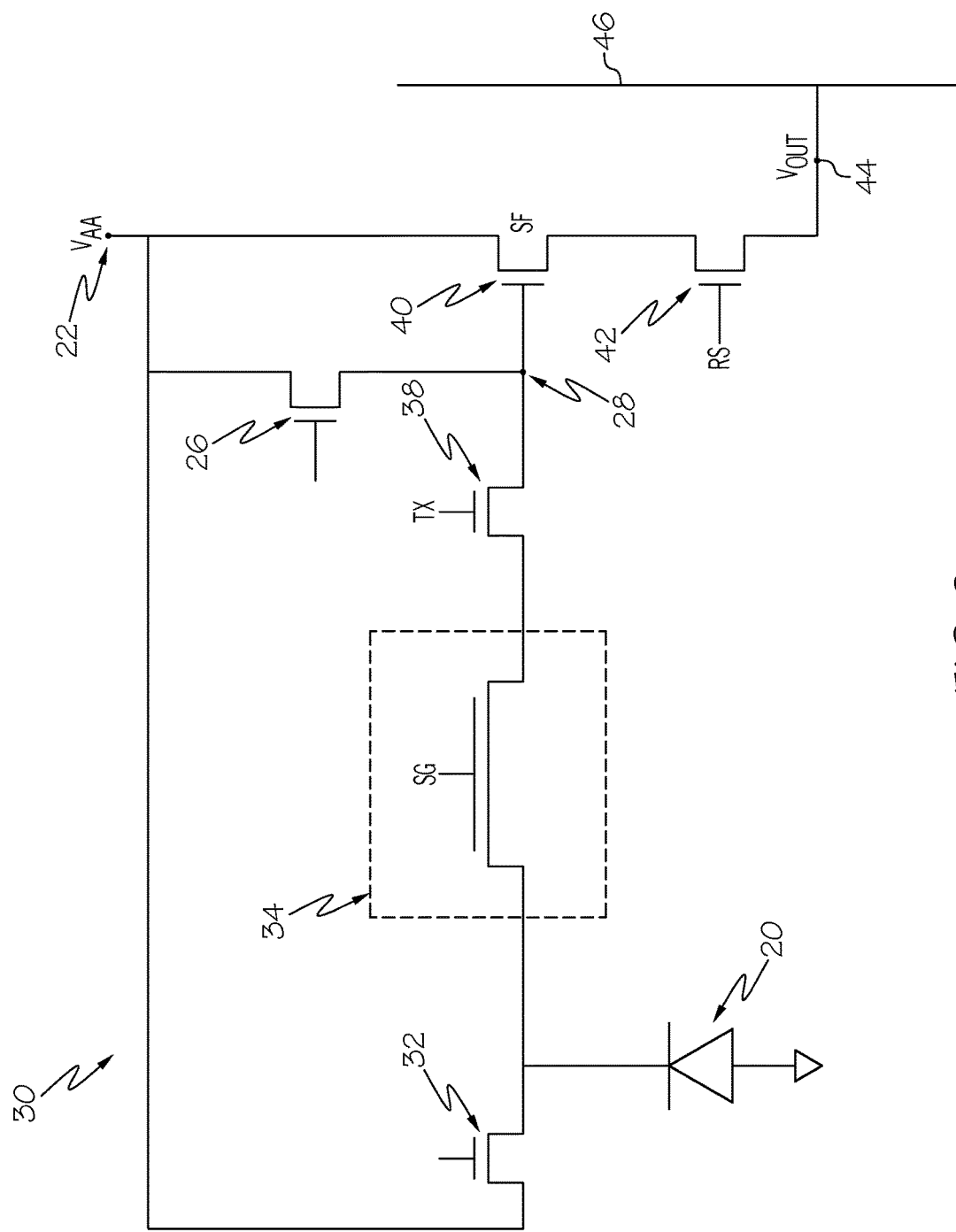
FIG. 2 is a diagram of an illustrative image pixel that uses a storage gate as a charge storage region for a global shutter in accordance with an embodiment of the present invention.

FIG. 2 is a circuit diagram of an illustrative image pixel 30. As shown in FIG. 2, pixel 30 includes a photosensitive element such as photodiode 20. A positive power supply voltage Vaa may be supplied at positive power supply terminal 22. Incoming light may be collected by photodiode 20. In certain embodiments, a color filter structure may be included and incoming light may pass through the color filter structure before being collected in photodiode 20. Photodiode 20 generates charge (e.g., electrons) in response to receiving impinging photons. The amount of charge that is collected by photodiode 20 depends on the intensity of the impinging light and the exposure duration (or integration time).

Before an image is acquired, reset transistor 26 may be turned on to reset charge storage node 28 (sometimes referred to as floating diffusion region FD) to Vaa. Reset transistor 26 may then be turned off.

Pixel 30 may include a pixel reset transistor such as reset transistor 32. When reset transistor 32 is turned on, photodiode 20 may be reset to power supply voltage Vaa (e.g., by connecting Vaa to photodiode 20 through reset transistor 32). When reset transistor 32 is turned off, photodiode 20 may be allowed to accumulate photo-generated charge.

Charge generated in photodiode 20 may be stored in charge storage region 34. As shown in FIG. 2, charge storage region 34 may include a storage gate (SG) that stores charge from photodiode 20. Charge storage region 34 may be used for temporarily storing charge from photodiode 20. In certain embodiments, charge storage region 34 may include a diffused diode and an intermediate transfer gate.

Pixel 30 may include a transfer gate (transistor) 38. Transfer transistor 38 may be turned on to transfer charge from charge storage region 34 to floating diffusion region 28. Floating diffusion region 28 may be a doped semiconductor region (e.g., a region in a silicon substrate that is doped by ion implantation, impurity diffusion, or other doping process).

Although not depicted in FIG. 2, an additional transfer gate may be included between photodiode 20 and charge storage region 34. The additional transfer gate may be turned on to transfer charge from photodiode to charge storage region. In embodiments where there is no additional transfer gate between photodiode 20 and charge storage region 34, the charge generated by photodiode 20 may immediately be stored in charge storage region 34.

Pixel 30 may also include charge readout circuitry. The charge readout circuitry may include row-select transistor 42 and source-follower transistor 40. Transistor 42 may have a gate that is controlled by a row select signal. When the row select signal is asserted, transistor 42 is turned on and a corresponding signal Vout (e.g. an output signal having a magnitude that is proportional to the amount of charge at floating diffusion node 28), is passed onto output path 44.

In a typical image pixel array configuration, there are numerous rows and columns of pixels 30. A column readout path such as output line 46 may be associated with each column of pixels 30 (e.g., each image pixel 30 in a column may be coupled to output line 46 through an associated row-select transistor 42). The row select signal may be asserted to read out signal Vout from a selected image pixel onto column readout path 46. Image data Vout may be fed to processing circuitry 18 for further processing. The circuitry of FIG. 2 is merely illustrative. If desired, pixel 30 may include other pixel circuitry.

Figure 3:
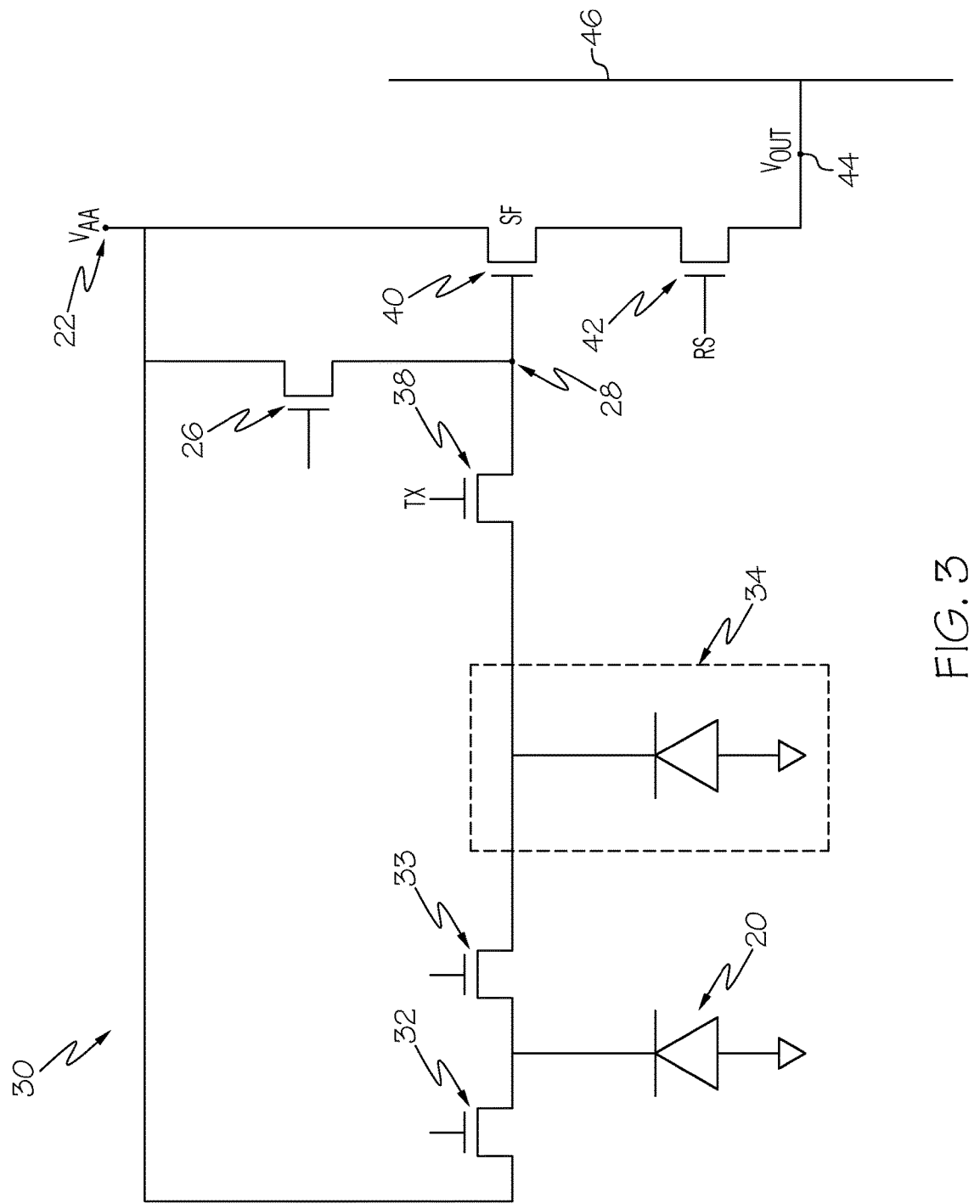
FIG. 3 is a diagram of an illustrative image pixel that uses a storage diode as a charge storage region for a global shutter in accordance with an embodiment of the present invention.

Instead of a storage gate (e.g., FIG. 2), charge storage region 34 may include a storage diode, as shown in FIG. 3. The storage diode may store charge from photodiode 20. The storage diode may be a doped semiconductor region (e.g., a region in a silicon substrate that is doped by ion implantation, impurity diffusion, or other doping process). FIG. 3 also shows an additional transfer transistor 33. Transfer transistor 33 may be turned on to transfer charge from photodiode 20 to storage diode 34.

Figure 4:
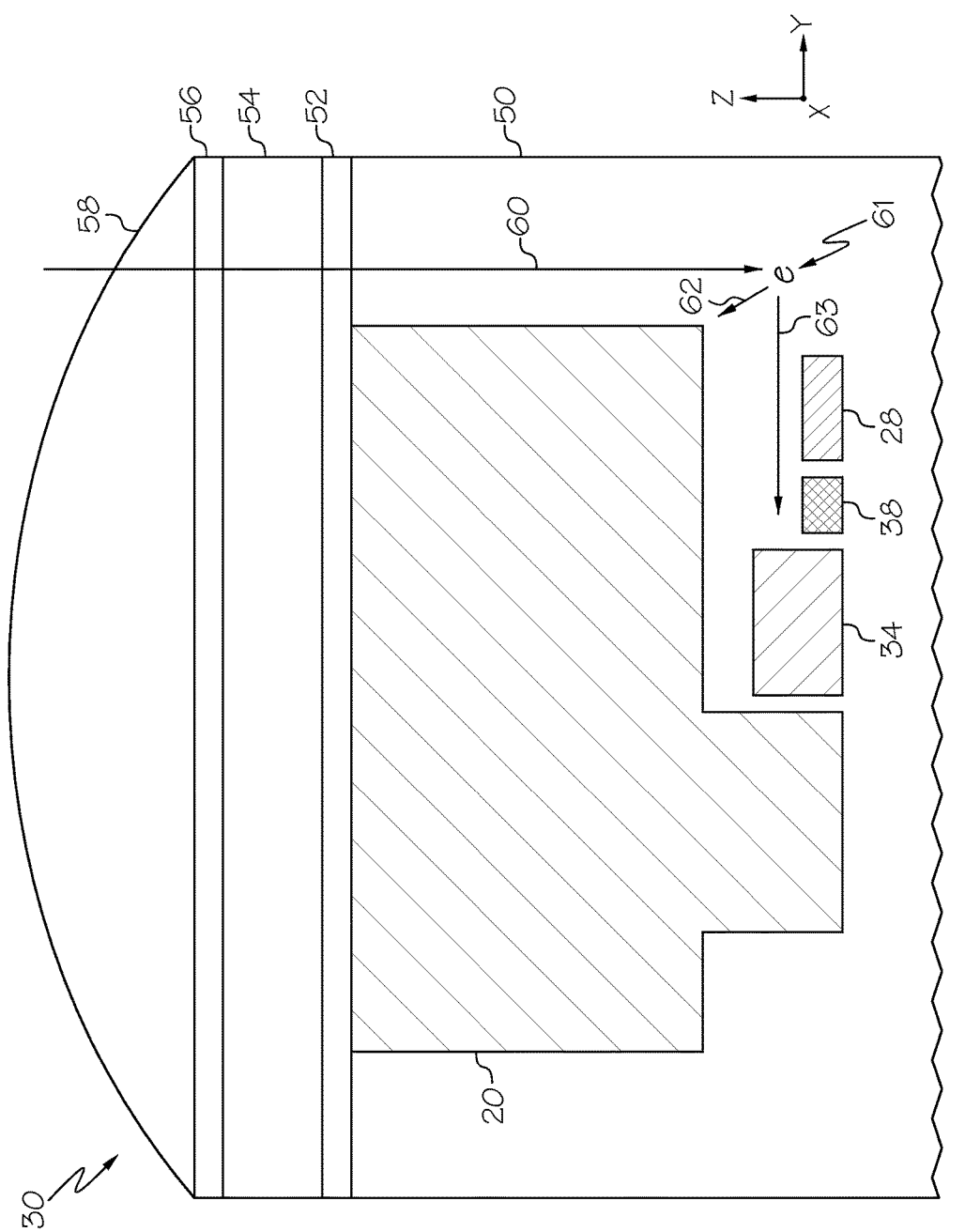
FIG. 4 is a cross-sectional side view of an illustrative image pixel with a charge storage region in accordance with an embodiment of the present invention.

FIG. 4 is a cross-sectional side view of a pixel with a charge storage region for a global shutter, such as the pixels shown in FIGS. 2 and 3. As shown, photodiode 20 may be formed in substrate 50. Substrate 50 may be a wafer, which is a layer of semiconductor material such as silicon. Substrate 50 may be crystalline silicon or another desired material. Photodiode 20 may be formed from n-type doped silicon. The substrate 50 surrounding photodiode 20 may be p-type doped silicon. In certain embodiments, the photodiode may be formed from p-type doped silicon and be surrounded by n-type doped silicon.

Photodiode 20 may be covered by passivation layer 52, color filter layer 54, planarization layer 56, and microlens 58. Passivation layer 52 and planarization layer 54 may be formed from dielectric materials. Color filter layer 54 may be a part of a larger color filter array. For example, each pixel in image sensor 14 may have an individual color filter layer that is part of the color filter array. Image sensor 14 may include a Bayer color filter array in which vertically and horizontally adjacent color filters in the array are of different colors. The Bayer color filter array includes red, green, and blue color filters. A single red, green, blue, cyan, magenta, yellow, near-infrared, infrared, or clear color filter may be formed over photodiode 20. In certain embodiments, the color filter formed over photodiode 20 may have areas that pass colored light and areas that are clear (i.e., that pass visible spectrum light). A microlens may be formed over each pixel in image sensor 14. Each microlens may direct light towards a respective photodiode.

Charge storage region 34, transfer transistor 38, and floating diffusion region 28 may be formed underneath a portion of photodiode 20. As mentioned previously, photodiode 20 may convert incoming light to charge. However, every photon that passes into pixel 30 may not be converted into charge that is collected by photodiode 20. For example, a photon may follow path 60 and pass through microlens 58 to enter pixel 30. The photon may enter substrate 50. The photon may be converted into charge (e.g., electron 61). At this point, the charge may follow path 62 and be collected by photodiode 20. However, the charge may instead follow path 63 and be collected by charge storage region 34. Charge storage region 34 may therefore collect charge that is not transferred from photodiode 20 during the operation of pixel 30.

During operation of the pixel, an amount of charge may be deliberately transferred to charge storage region 34 from photodiode 20. Ideally, this would be the only charge present in charge storage region 34 after the transfer. However, additional charge may be present (e.g., charge that follows path 63). Additional charge may also be generated and stored in charge storage region 34 due to the presence of dark current. This additional charge is a source of noise for the pixel and, if unaccounted for, may reduce the quality of images produced by an image sensor with pixels such as pixel 30 in FIG. 4.

In FIG. 4, pixel 30 is depicted as a back-side illuminated (BSI) pixel. However, pixel 30 may be a front-side illuminated (FSI) pixel if desired.

Other modifications may be made to the pixel shown in FIGS. 2, 3, and 4 as desired. For example, FIGS. 2 and 3 show a single photodiode, reset transistor, and floating diffusion region for each pixel. However, this example is merely illustrative. If desired, multiple pixels may share one or both of a reset transistor and a floating diffusion region. Other transistors and pixel circuitry in pixel 30 may be shared between any number of pixels if desired.

The pixel circuitry of pixel 30 may all be formed in a single substrate (e.g., substrate 50 in FIG. 4). The substrate may be a wafer. The substrate may be crystalline silicon or another desired material. If desired, the pixel circuitry may be split between two or more wafers. For example, the photodiode may be formed in an upper wafer while the source follower transistor may be formed in a lower wafer. The wafers may be connected by an interconnect layer, which may be formed from a metal such as copper. The interconnect layer may also include solder or be a through silicon via (TSV). In general, any component in pixel 30 may be formed in any layer in a stacked pixel. Interconnect layers may be formed between any components in pixel 30 (e.g., between floating diffusion region 28 and source follower transistor 40, between source follower transistor 40 and row select transistor 42, between transfer transistor 38 and floating diffusion region 28, etc.).

Figure 5:
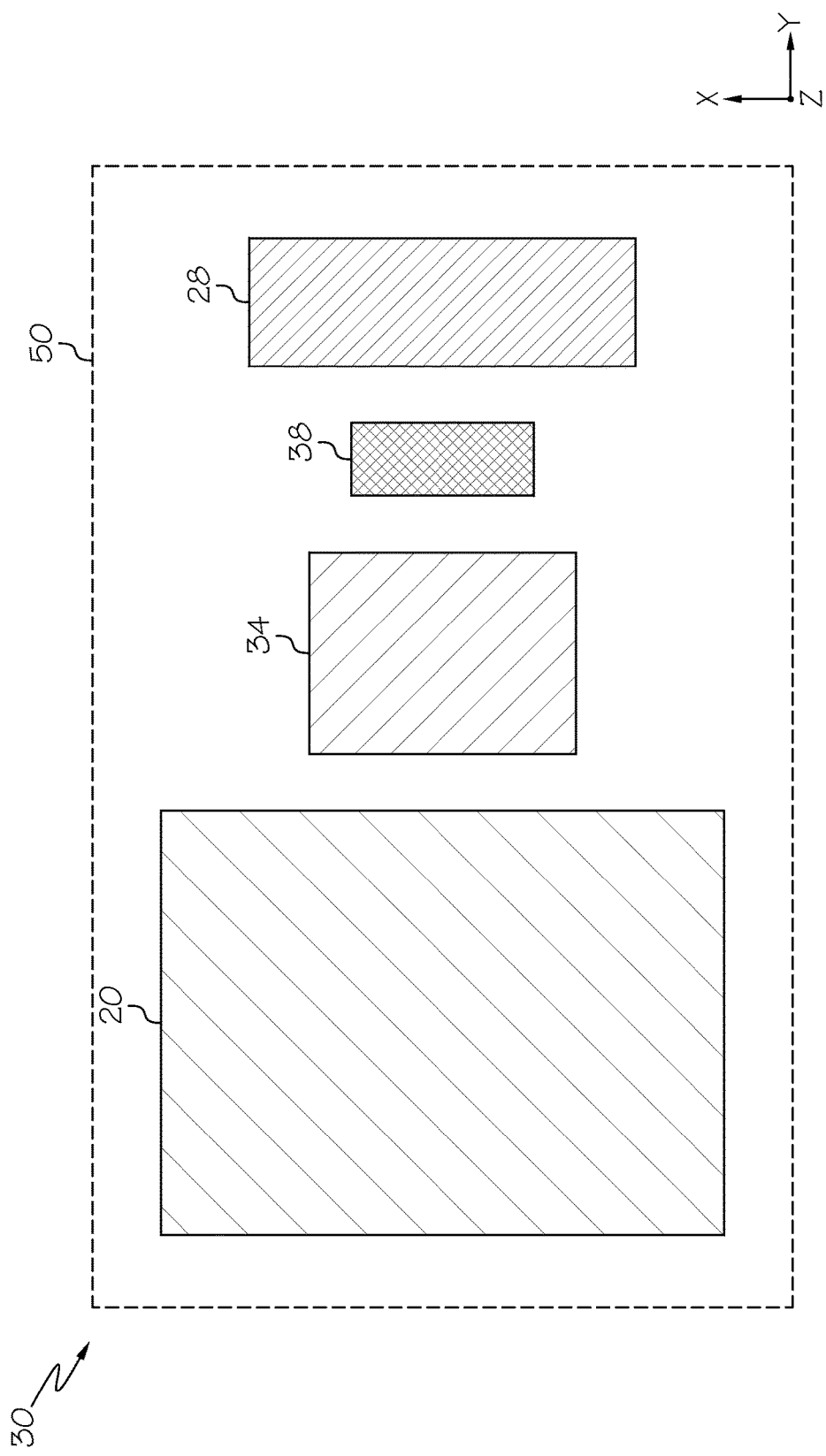
FIG. 5 is a cross-sectional top view of the illustrative image pixel of FIG. 4 in accordance with an embodiment of the present invention.

FIG. 5 is a cross-sectional top view of an image pixel such as the pixel shown in FIG. 2 or FIG. 3. As shown, there may be a single charge storage region 34 adjacent to photodiode 20. Transfer transistor 38 may also be adjacent to charge storage region 34 and may be used to transfer charge from charge storage region 34 to floating diffusion region 28.

Figure 6:
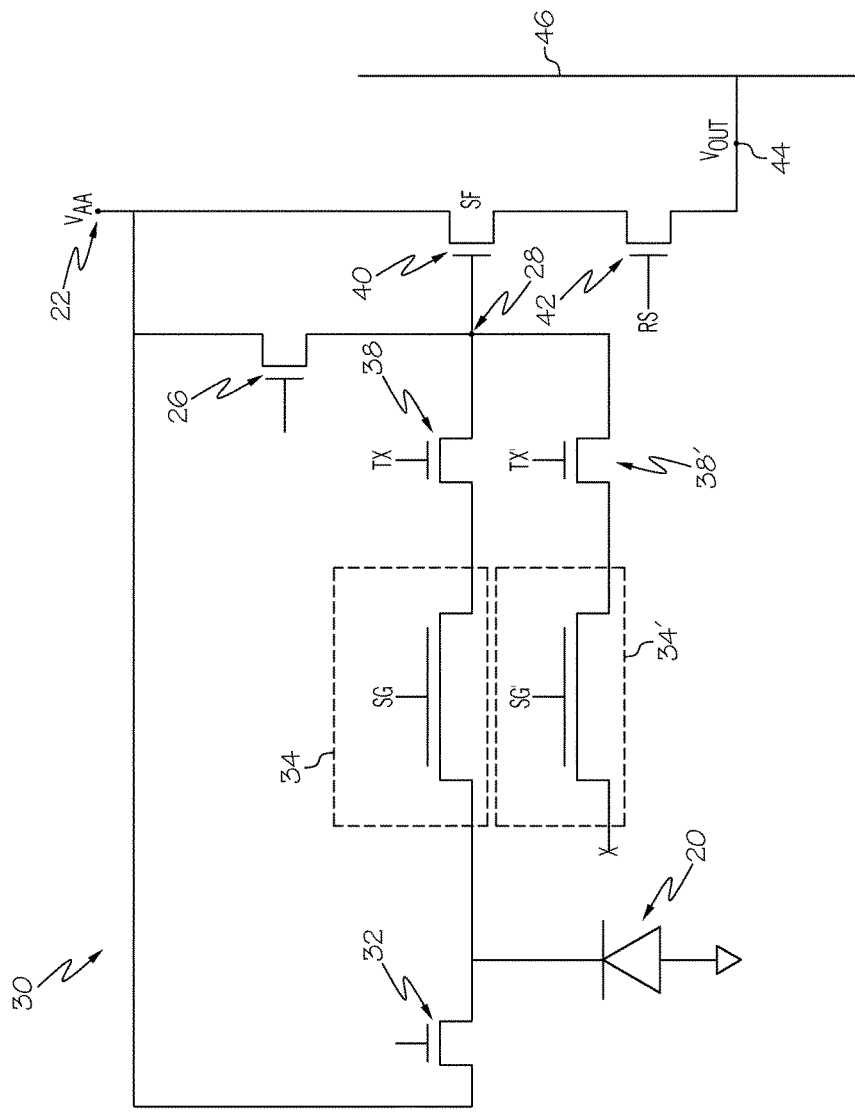
FIG. 6 is a diagram of an illustrative image pixel that has two adjacent charge storage regions in accordance with an embodiment of the present invention.

Using a single charge storage region, as shown in FIG. 5, may result in noise from incident light on the charge storage region affecting pixel performance. As shown in FIG. 6, in order to reduce the amount of noise from incident light on the charge storage region, pixel 30 may be provided with an additional charge storage region 34' that is in parallel with charge storage region 34.

Pixel 30 in FIG. 6 may have the same operating scheme as the pixels in FIGS. 2 and 3. However, additional charge storage region 34' and an additional transfer transistor 38' are provided. Charge storage region 34' may not be coupled to photodiode 20. Therefore, the only charge received by charge storage region 34' will be from incident light noise or dark current. The charge in charge storage region 34' can then be used to help determine the amount of noise that is present in charge storage region 34. For example, the amount of noise from incident light on the charge storage region (as determined by charge storage region 34') may be subtracted from the total charge determined by charge storage region 34 to determine the amount of charge generated by photodiode 20.

Figure 7:
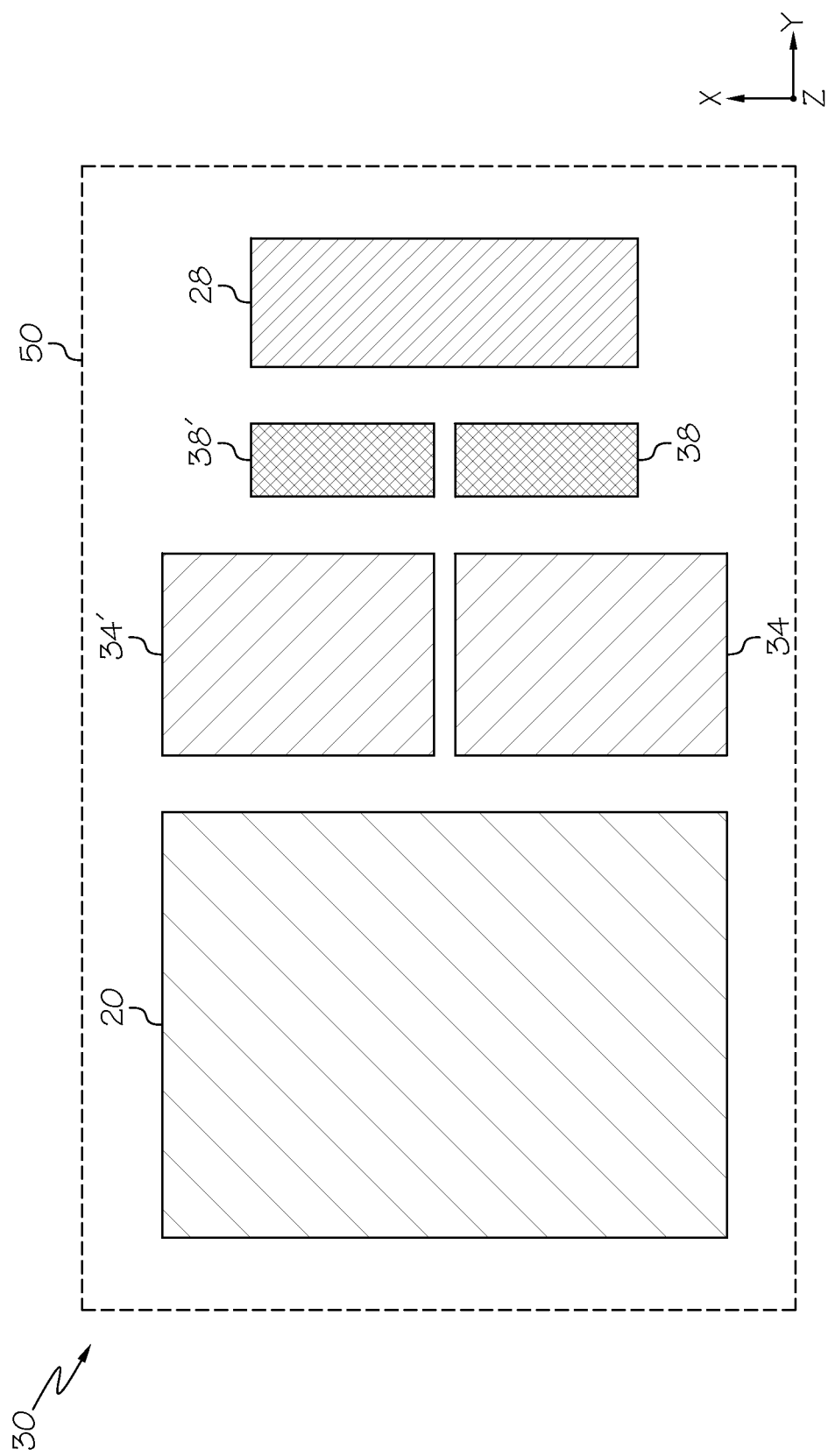
FIG. 7 is a cross-sectional top view of an illustrative image pixel with two charge storage regions that have the same shape and size in accordance with an embodiment of the present invention.

As shown in FIG. 7, the size and shape of charge storage region 34' may be the same as charge storage region 34. Making the charge storage regions identical in shape and size will help ensure that the amount of charge gathered in the charge storage regions from incident light is the same. This will ensure that the noise-corrected data provided by pixel 30 is as accurate as possible. In certain embodiments, charge storage region 34' and charge storage region 34 may be the same size but different shapes. In other embodiments, charge storage region 34' and charge storage region 34 may be the same shape but have different sizes.

Figure 8:
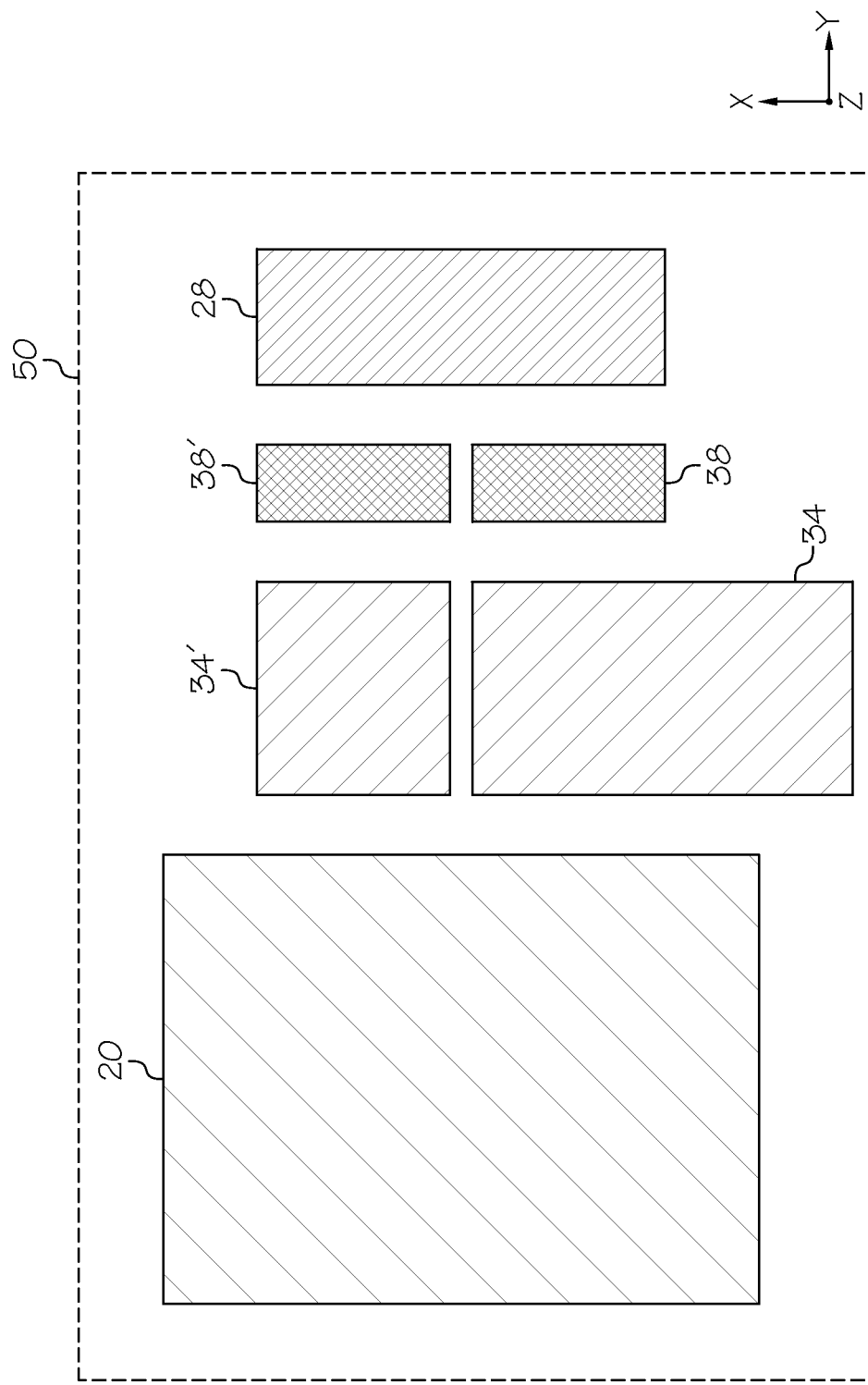
FIG. 8 is a cross-sectional top view of an illustrative image pixel with two charge storage regions that have different sizes in accordance with an embodiment of the present invention.

In certain embodiments, charge storage region 34' may be smaller than charge storage region 34, as shown in FIG. 8. This embodiment may help conserve space in pixel 30 and ensure that there is as much room as necessary for charge storage region 34 and photodiode 20. After readout of the charge from charge storage region 34', the value may be corrected digitally to compensate for the smaller size of charge storage region 34'. In one illustrative example, charge storage region 34' may be half of the size as charge storage region 34. The amount of noise from incident light on charge storage region 34' may be doubled during processing to account for the increased size of charge storage region 34.

Figure 9:
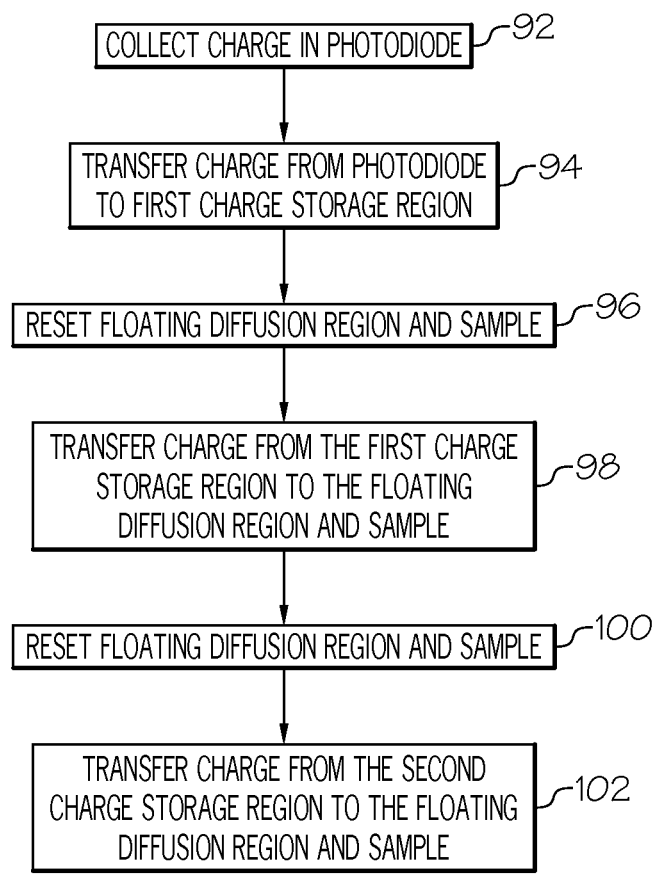
FIG. 9 is a flowchart of illustrative steps that may be used to operate a pixel with multiple charge storage regions in accordance with an embodiment of the present invention.

FIG. 9 is a flowchart of illustrative steps that may be used to operate a pixel such as pixel 30 in FIG. 6. At step 92, charge may be collected in photodiode 20. Charge may be collected for a predetermined integration time. Once the integration time has been completed, the charge collected in photodiode 20 may be transferred to charge storage region 34 at step 94. Once in charge storage region 34, floating diffusion region 28 may be reset (e.g., using reset transistor 26) and the charge at floating diffusion region 28 sampled at step 96. After the reset charge level is sampled, the charge may be transferred from charge storage region 34 to floating diffusion region 28 (e.g., using transfer transistor 38) at step 98. The charge at floating diffusion region 28 may then be sampled. Sampling the charge at floating diffusion region 28 before and after charge transfer may be referred to as a correlated double sampling (CDS) technique. The CDS technique may allow for reset noise to be accounted for when sampling charge from floating diffusion region 28. For example, the value obtained at step 96 may be subtracted from the value obtained at step 98 to determine the amount of charge collected in photodiode 20 and in charge storage region 34.

At step 100, floating diffusion region 28 may be reset and the charge at floating diffusion region 28 sampled. After the reset charge level is sampled, the charge may be transferred from charge storage region 34' to floating diffusion region 28 (e.g., using transfer transistor 38') at step 102. The charge at floating diffusion region 28 may then be sampled. The value obtained at step 100 may be subtracted from the value obtained at step 102 to determine the amount of charge collected in charge storage region 34'. This value may then be subtracted from the amount of charge collected in photodiode 20 and charge storage region 34 during the integration time to determine the amount of charge collected only in photodiode 20 during the integration time (e.g., accounting for incident light causing charge to be collected in charge storage region 34).

In various embodiments of the invention, an imaging pixel may include a floating diffusion region, a photodiode, a first charge storage region that is coupled to the floating diffusion region and the photodiode, and a second charge storage region that is coupled to the floating diffusion region. The second charge storage region may not be coupled to the photodiode. The imaging pixel may also include some or all of a first transfer transistor interposed between the first charge storage region and the floating diffusion region, a second transfer transistor interposed between the second charge storage region and the floating diffusion region, a source follower transistor coupled to the floating diffusion region, and a third transfer transistor interposed between the first charge storage region and the photodiode.

The first charge storage region may have a first size and a first shape while the second charge storage region may have a second size and a second shape. The first size may be the same as the second size, and the first shape may be the same as the second shape. Alternatively, the second size may be smaller than the first size. The first and second charge storage regions may be interposed between the photodiode and the floating diffusion region, and the first and second charge storage regions may be adjacent. The first and second charge storage regions may be storage gates or storage diodes. The imaging pixel may be a back-side illuminated pixel.

In various embodiments of the invention, an image sensor may include a plurality of imaging pixels. Each imaging pixel may include a floating diffusion region, a photodiode, a first charge storage region that is interposed between the photodiode and the floating diffusion region, and a second charge storage region that is interposed between the photodiode and the floating diffusion region. The first charge storage region may be coupled directly to the photodiode, while the second charge storage region may not be coupled directly to the photodiode. The first charge storage region may be coupled to the photodiode and the floating diffusion region, while the second charge storage region may be coupled only to the floating diffusion region.

Each imaging pixel may include a first transfer transistor interposed between the first charge storage region and the floating diffusion region. The first transfer transistor may be configured to transfer charge from the first charge storage region to the floating diffusion region. Each imaging pixel may include a second transfer transistor interposed between the second charge storage region and the floating diffusion region. The second transfer transistor may be configured to transfer charge from the second charge storage region to the floating diffusion region. Each imaging pixel may include a third transfer transistor interposed between the first charge storage region and the photodiode. The third transfer transistor may be configured to transfer charge from the photodiode to the second charge storage region. The first and second charge storage regions may have the same size.

In various embodiments of the invention, a method for operating an imaging pixel with a floating diffusion region, a photodiode, a first charge storage region, and a second charge storage region may include collecting a first amount of charge in the photodiode, transferring the first amount of charge from the photodiode to the first charge storage region, transferring the first amount of charge from the first charge storage region to the floating diffusion region, sampling the first amount of charge at the floating diffusion region after transferring the first amount of charge from the first charge storage region to the floating diffusion region, transferring a second amount of charge from the second charge storage region to the floating diffusion region after sampling the first amount of charge at the floating diffusion region, and sampling the second amount of charge at the floating diffusion region after transferring the second amount of charge from the second charge storage region to the floating diffusion region.

The method may also include resetting the floating diffusion region to a power supply voltage and sampling a third amount of charge at the floating diffusion region after transferring the first amount of charge from the photodiode to the first charge storage region and before transferring the first amount of charge from the first charge storage region to the floating diffusion region, and resetting the floating diffusion region to a power supply voltage and sampling a fourth amount of charge at the floating diffusion region after sampling the first amount of charge at the floating diffusion region and before transferring the second amount of charge from the second charge storage region to the floating diffusion region.

The foregoing is merely illustrative of the principles of this invention and various modifications can be made by those skilled in the art without departing from the scope and spirit of the invention.

What is claimed is:

1. An imaging pixel comprising:
    a floating diffusion region;
    a photodiode;
    a first charge storage region that is coupled to the floating diffusion region and the photodiode; and
    a second charge storage region that is coupled to the floating diffusion region, wherein the second charge storage region is not coupled to the photodiode, wherein the first charge storage region has a first size and a first shape, wherein the second charge storage region has a second size and a second shape, wherein the first size is the same as the second size, and wherein the first shape is the same as the second shape.

2. The imaging pixel defined in claim 1, further comprising:
    a first transfer transistor interposed between the first charge storage region and the floating diffusion region.

3. The imaging pixel defined in claim 2, further comprising:
    a second transfer transistor interposed between the second charge storage region and the floating diffusion region.

4. The imaging pixel defined in claim 3, further comprising:
    a source follower transistor coupled to the floating diffusion region.

5. The imaging pixel defined in claim 3, further comprising:
    a third transfer transistor interposed between the first charge storage region and the photodiode.

6. The imaging pixel defined in claim 1, wherein the first and second charge storage regions are interposed between the photodiode and the floating diffusion region, and wherein the first and second charge storage regions are adjacent.

7. The imaging pixel defined in claim 1, wherein the first and second charge storage regions are storage gates.

8. The imaging pixel defined in claim 1, wherein the first and second charge storage regions are storage diodes.

9. The imaging pixel defined in claim 1, wherein the imaging pixel is a back-side illuminated pixel.

10. An image sensor comprising a plurality of imaging pixels, wherein each imaging pixel comprises:
    a floating diffusion region
    a photodiode
    a first charge storage region that is interposed between the photodiode and the floating diffusion region, wherein the first charge storage region is coupled directly to the photodiode;
    a second charge storage region that is interposed between the photodiode and the floating diffusion region, wherein the second charge storage region is not coupled directly to the photodiode;
    a first transfer transistor interposed between the first charge storage region and the floating diffusion region, wherein the first transfer transistor is configured to transfer charge from the first charge storage region directly to the floating diffusion region without the charge reaching the second charge storage region; and
    a second transfer transistor interposed between the second charge storage region and the floating diffusion region, wherein the second transfer transistor is configured to transfer charge from the second charge storage region directly to the floating diffusion region without the charge reaching the first charge storage region.

11. The image sensor defined in claim 10, wherein the first charge storage region is coupled to the floating diffusion region and wherein the second charge storage region is coupled to the floating diffusion region.

12. The image sensor defined in claim 10, wherein each imaging pixel further comprises:
    a third transfer transistor interposed between the first charge storage region and the photodiode, wherein the third transfer transistor is configured to transfer charge from the photodiode to the first charge storage region.

13. The image sensor defined in claim 10, wherein the first and second charge storage regions have the same size.

14. A method for operating an imaging pixel, wherein the imaging pixel comprises a floating diffusion region, a photodiode, a first charge storage region, and a second charge storage region, the method comprising:
    collecting a first amount of charge in the photodiode;
    transferring the first amount of charge from the photodiode to the first charge storage region;
    transferring the first amount of charge from the first charge storage region to the floating diffusion region;
    after transferring the first amount of charge from the first charge storage region to the floating diffusion region, sampling the first amount of charge at the floating diffusion region;

after sampling the first amount of charge at the floating diffusion region, resetting the floating diffusion region to a power supply voltage;

after resetting the floating diffusion region to the power supply voltage, transferring a second amount of charge from the second charge storage region to the floating diffusion region; and after transferring the second amount of charge from the second charge storage region to the floating diffusion region, sampling the second amount of charge at the floating diffusion region.

15. The method defined in claim 14, further comprising:

before transferring the first amount of charge from the first charge storage region to the floating diffusion region, resetting the floating diffusion region to the power supply voltage and sampling a third amount of charge at the floating diffusion region; and after resetting the floating diffusion region to the power supply voltage and before transferring the second amount of charge from the second charge storage region to the floating diffusion region, sampling a fourth amount of charge at the floating diffusion region.

\* \* \* \* \*